(12) United States Patent
Tian et al.

(10) Patent No.: US 10,644,195 B2
(45) Date of Patent: May 5, 2020

(54) MANUFACTURING METHOD OF LIGHT EMITTING DIODE DEVICE AND LIGHT EMITTING DIODE DEVICE HAVING LIGHT EMITTING UNITS WITH EACH LIGHT EMITTING UNIT INCLUDING SECOND SUB LIGHT EMITTING UNIT IN TANDEM WITH FIRST SUB LIGHT EMITTING UNIT

(71) Applicants: BOE Technology Group Co., Ltd., Beijing (CN); Beijing BOE Optoelectronics Technology Co., Ltd., Beijing (CN)

(72) Inventors: Ting Tian, Beijing (CN); Ming Zhai, Beijing (CN); Shuqian Dou, Beijing (CN); Dayong Zhou, Beijing (CN); Jun Cheng, Beijing (CN); Xiaoliang Fu, Beijing (CN); Zhiqiang Fan, Beijing (CN); Taesung Kang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/813,803

(22) Filed: Nov. 15, 2017

(65) Prior Publication Data

US 2018/0269352 A1    Sep. 20, 2018

(30) Foreign Application Priority Data

Mar. 15, 2017  (CN) .......................... 2017 1 0153752

(51) Int. Cl.
*H01L 33/08* (2010.01)
*H01L 33/00* (2010.01)
(Continued)

(52) U.S. Cl.
CPC .......... *H01L 33/08* (2013.01); *H01L 25/0753* (2013.01); *H01L 27/153* (2013.01);
(Continued)

(58) Field of Classification Search
CPC ..... H01L 33/0095; H01L 33/06; H01L 33/12; H01L 33/28; H01L 33/32; H01L 33/34;
(Continued)

(56) References Cited

U.S. PATENT DOCUMENTS 5,814,841 A * 9/1998 Kusuda ...................... B41J 2/45
224/238
9,666,764 B2 * 5/2017 Bergmann .......... H01L 33/0079
(Continued)

FOREIGN PATENT DOCUMENTS

CN         102270716 B      1/2013
CN         101263610 B      3/2013

OTHER PUBLICATIONS

Jul. 4, 2018—(CN) First Office Action Appn 201710153752.5 with English Translation.

*Primary Examiner* — Michael Jung
(74) *Attorney, Agent, or Firm* — Banner & Witcoff, Ltd.

(57) ABSTRACT

A manufacturing method of a light emitting diode device and a light emitting diode device are provided. The manufacturing method of the light emitting diode device includes: forming a light emitting lamination layer on a base substrate, the light emitting lamination layer including a first semiconductor layer, a first light emitting layer, a second semiconductor layer, a second light emitting layer and a third semiconductor layer sequentially formed on the base substrate; dividing the light emitting lamination layer to form a plurality of light emitting units spaced from each other, each light emitting unit including a first area and a second area spaced from each other; and removing the third semicon-
(Continued)

ductor layer and the second light emitting layer in the first area to form a first sub light emitting unit, and the second area being used for forming a second sub light emitting unit.

20 Claims, 6 Drawing Sheets

(51) Int. Cl.
  *H01L 33/06* (2010.01)
  *H01L 33/12* (2010.01)
  *H01L 33/28* (2010.01)
  *H01L 33/32* (2010.01)
  *H01L 33/34* (2010.01)
  *H01L 25/075* (2006.01)
  *H01L 33/30* (2010.01)
  *H01L 27/15* (2006.01)
  *H01L 33/62* (2010.01)

(52) U.S. Cl.
  CPC ........ *H01L 27/156* (2013.01); *H01L 33/0095* (2013.01); *H01L 33/06* (2013.01); *H01L 33/12* (2013.01); *H01L 33/28* (2013.01); *H01L 33/30* (2013.01); *H01L 33/32* (2013.01); *H01L 33/34* (2013.01); *H01L 33/62* (2013.01); *H01L 2933/0066* (2013.01)

(58) Field of Classification Search
  CPC ..... H01L 33/62; H01L 25/0753; H01L 33/30; H01L 51/5036; H01L 51/504; H01L 51/5044; H01L 33/08
  See application file for complete search history.

(56) References Cited

U.S. PATENT DOCUMENTS

| | | | |
|---|---|---|---|
| 2009/0267085 A1* | 10/2009 | Lee | F21K 9/00 257/88 |
| 2011/0007771 A1* | 1/2011 | Bessho | B82Y 20/00 372/50.121 |
| 2013/0016752 A1 | 1/2013 | Lell et al. | |
| 2014/0008671 A1 | 1/2014 | Kim et al. | |
| 2017/0025567 A1* | 1/2017 | Lu | H01L 27/153 |
| 2017/0033317 A1* | 2/2017 | Kajimoto | H01L 51/5044 |
| 2018/0083226 A1* | 3/2018 | Ichikawa | H01L 27/322 |

* cited by examiner

S01 — forming a light emitting lamination layer on a base substrate, the light emitting lamination layer comprising a first semiconductor layer with a first conductive type, a first light emitting layer, a second semiconductor layer with a second conductive type, a second light emitting layer and a third semiconductor layer with the first conductive type sequentially formed on the base substrate S02 — dividing the light emitting lamination layer to form a plurality of light emitting units which are spaced from each other, each light emitting unit comprising a first area and a second area spaced from each other S03 — removing the third semiconductor layer and the second light emitting layer in the first area to form a first sub light emitting unit, and the second area being used for forming a second sub light emitting unit

Fig. 1

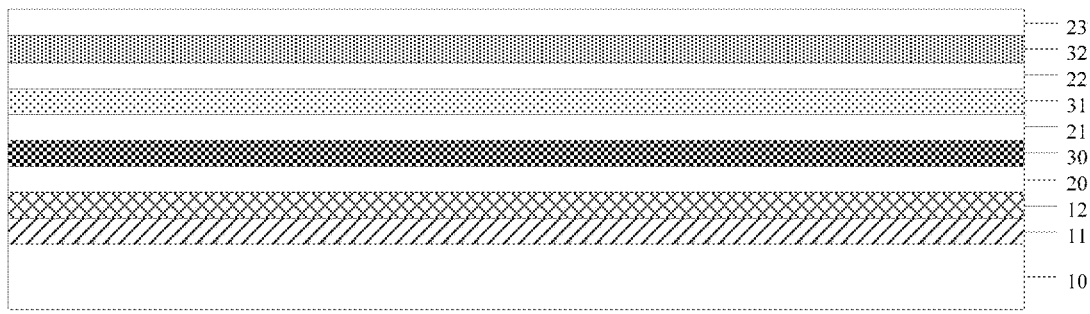

Fig. 2a

MANUFACTURING METHOD OF LIGHT EMITTING DIODE DEVICE AND LIGHT EMITTING DIODE DEVICE HAVING LIGHT EMITTING UNITS WITH EACH LIGHT EMITTING UNIT INCLUDING SECOND SUB LIGHT EMITTING UNIT IN TANDEM WITH FIRST SUB LIGHT EMITTING UNIT

This application claims priority to and the benefit of Chinese Patent Application No. 201710153752.5, filed Mar. 15, 2017, which application is incorporated herein in its entirety.

TECHNICAL FIELD

Embodiments of the present disclosure relate to a manufacturing method of a light emitting diode device and a light emitting diode device.

BACKGROUND

A light emitting diode (LED) is a semiconductor solid light emitting electronic component. The LED has characteristics, such as small size, high brightness, low energy consumption, long life and so on, and has been widely used in displays, backlights, lighting and other areas.

With the development of technology, the LED display panel is developing toward a high resolution direction, and is gradually getting favor with some high-end display applications. Currently, a red sub-pixel, a green sub-pixel and a blue sub-pixel in a full color LED display panel need to be formed separately, and then the red sub-pixel, the green sub-pixel and the blue sub-pixel are assembled or encapsulated into a pixel unit, so as to realize the full color luminescence. However, due to the limitation of the manufacturing process, the size of each sub-pixel in the LED display panel and the spacing between the sub-pixels become the key factor that restricts the development of the LED display panel to high resolution.

SUMMARY

At least one embodiment of the present disclosure provides a manufacturing method of a light emitting diode (LED) device, which comprises: forming a light emitting lamination layer on a base substrate, the light emitting lamination layer comprising a first semiconductor layer with a first conductive type, a first light emitting layer, a second semiconductor layer with a second conductive type, a second light emitting layer and a third semiconductor layer with the first conductive type sequentially formed on the base substrate; dividing the light emitting lamination layer to form a plurality of light emitting units spaced from each other, each light emitting unit comprising a first area and a second area spaced from each other; and removing the third semiconductor layer and the second light emitting layer in the first area to form a first sub light emitting unit, and the second area being used for forming a second sub light emitting unit.

For example, the manufacturing method of the light emitting diode device provided by at least one embodiment of the present disclosure further comprises: etching the second semiconductor layer and the first light emitting layer of the first sub light emitting unit to expose a portion of the first semiconductor layer; and etching the third semiconductor layer and the second light emitting layer of the second sub light emitting unit to expose a portion of the second semiconductor layer.

For example, the manufacturing method of the light emitting diode device provided by at least one embodiment of the present disclosure further comprises: in the first sub light emitting unit, forming a first electrode and a second electrode respectively on an exposed portion of the first semiconductor layer and the second semiconductor layer; and in the second sub light emitting unit, forming a third electrode and a fourth electrode respectively on the third semiconductor layer and an exposed portion of the second semiconductor layer.

For example, in the manufacturing method of the light emitting diode device provided by at least one embodiment of the present disclosure, the light emitting lamination layer further comprises a third light emitting layer and a fourth semiconductor layer with the second conductive type sequentially formed on the third semiconductor layer; each light emitting unit further comprises a third area spaced apart from the first area and the second area; the manufacturing method comprises: removing the fourth semiconductor layer, the third light emitting layer, the third semiconductor layer and the second light emitting layer in the first area to form the first sub light emitting unit, and removing the fourth semiconductor layer and the third light emitting layer in the second area to form the second sub light emitting unit, and the third area being used for forming a third sub light emitting unit.

For example, the manufacturing method of the light emitting diode device provided by at least one embodiment of the present disclosure further comprises: etching the fourth semiconductor layer and the third light emitting layer of the third sub light emitting unit to expose a portion of the third semiconductor layer.

For example, the manufacturing method of the light emitting diode device provided by at least one embodiment of the present disclosure further comprises: in the third sub light emitting unit, forming a fifth electrode and a sixth electrode respectively on an exposed portion of the third semiconductor layer and the fourth semiconductor layer.

For example, the manufacturing method of the light emitting diode device provided by at least one embodiment of the present disclosure further comprises: providing a substrate; forming a plurality of contact electrodes insulated from each other on the substrate; and boding each light emitting unit to the substrate, and each light emitting unit being electrically connected with corresponding contact electrodes.

For example, the manufacturing method of the light emitting diode device provided by at least one embodiment of the present disclosure further comprises: forming a buffer layer on the base substrate. The light emitting lamination layer is formed on the buffer layer.

At least one embodiment of the present disclosure provides a light emitting diode (LED) device, which comprises: a plurality of light emitting units. Each of the light emitting units comprises a first sub light emitting unit and a second light emitting unit spaced apart from each other. The first sub light emitting unit comprises a first semiconductor layer with a first conductive type, a first light emitting layer and a second semiconductor layer with a second conductive type, which are sequentially disposed; and the second sub light emitting unit comprises the first semiconductor layer, the first light emitting layer, the second semiconductor layer, a second light emitting layer and a third semiconductor layer with the first conductive type, which are sequentially disposed.

For example, in the light emitting diode device provided by at least one embodiment of the present disclosure, in the first sub light emitting unit, the first light emitting layer and the second semiconductor layer partially cover the first semiconductor layer, a first electrode is disposed on an exposed portion of the first semiconductor layer, and a second electrode is disposed on the second semiconductor layer; in the second sub light emitting unit, the second light emitting layer and the third semiconductor layer partially cover the second semiconductor layer, a fourth electrode is disposed on an exposed portion of the second semiconductor layer, and a third electrode is disposed on the third semiconductor layer.

For example, in the light emitting diode device provided by at least one embodiment of the present disclosure, each of the light emitting units further comprises a third sub light emitting unit spaced apart from the first sub light emitting unit and the second light emitting unit. The third sub light emitting unit comprises the first semiconductor layer, the first light emitting layer, the second semiconductor layer, the second light emitting layer, the third semiconductor layer, a third light emitting layer and a fourth semiconductor layer with the second conductive type, which are sequentially disposed.

For example, in the light emitting diode device provided by at least one embodiment of the present disclosure, in the third sub light emitting unit, the third light emitting layer and the fourth semiconductor layer partially cover the third semiconductor layer, a fifth electrode is disposed on an exposed portion of the third semiconductor layer, and a sixth electrode is disposed on the fourth semiconductor layer.

For example, the light emitting diode device provided by at least one embodiment of the present disclosure further comprises a substrate. The substrate comprises a plurality of contact electrodes insulated from each other, and each light emitting unit is bonded to the substrate and is electrically connected with corresponding contact electrodes.

For example, in the light emitting diode device provided by at least one embodiment of the present disclosure, each of the light emitting units further comprises a buffer layer, and the first semiconductor layer is disposed on the buffer layer.

For example, in the light emitting diode device provided by at least one embodiment of the present disclosure, color of light emitted by the first sub light emitting unit is different from color of light emitted by the second sub light emitting unit.

It should be understood that the above general description of the present disclosure and the following detailed description are both illustrative and explanatory, and are intended to further illustrate the present disclosure.

BRIEF DESCRIPTION OF THE DRAWINGS

In order to clearly illustrate the technical solution of embodiments of the present disclosure, the drawings of the embodiments or related technical description will be briefly described in the following; it is obvious that the drawings in the description are only related to some embodiments of the present disclosure and not limited to the present disclosure.

FIG. 1 is a schematic diagram of a manufacturing method of a light emitting diode (LED) device provided by an embodiment of the present disclosure;

FIGS. 2a-2j are process flow diagrams of a manufacturing method of a light emitting diode (LED) device provided by an embodiment of the present disclosure.

DETAILED DESCRIPTION

Figure 2B:
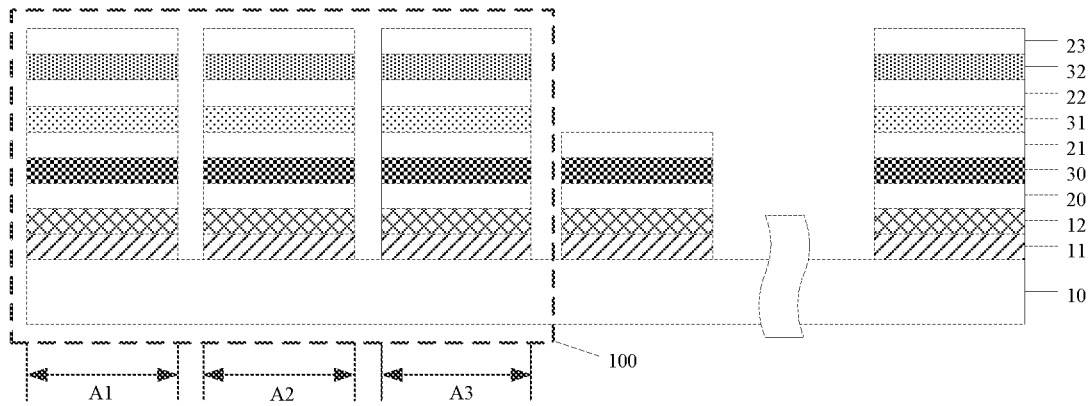

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "include," etc., are intended to specify that the elements or the objects stated before these terms encompass the elements or the objects and equivalents thereof listed after these terms, but do not preclude the other elements or objects.

Each component or structure in the drawings is not drawn in strict accordance with the proportion of rendering, for clarity, the size of each component or structure may be exaggerated or reduced, such as increasing the thickness of the layer, the width of the electrode and etc., but these should not be used to limit the scope of the present disclosure. In order to make the following description of the embodiments of the present disclosure clear and simple, the detailed description of the known function(s) and the known component(s) can be omitted.

Currently, sub-pixels in a full-color light emitting diode (LED) display panel need to be made of different epitaxial wafers respectively, then the epitaxial wafers need to be sliced individually to obtain the sub-pixels, and finally, each sub-pixel is attached to a corresponding position on a base substrate by a vacuum suction nozzle, so as to form the LED display panel. The production efficiency is low, the manufacturing time of the product is long, the cost of the product is expensive, the spacing between the sub-pixels is large, and the resolution ratio of the LED display panel is low, so that the development of the LED display panel toward the high resolution direction is limited.

At least one embodiment of the present disclosure provides s a manufacturing method of a light emitting diode device and a light emitting diode device. The manufacturing method of the light emitting diode device comprises: forming a light emitting lamination layer on a base substrate, the light emitting lamination layer comprising a first semiconductor layer with a first conductive type, a first light emitting layer, a second semiconductor layer with a second conductive type, a second light emitting layer and a third semiconductor layer with the first conductive type sequentially formed on the base substrate; dividing the light emitting lamination layer to form a plurality of light emitting units which are spaced from each other, each light emitting unit comprising a first area and a second area spaced from each other; and removing the third semiconductor layer and the second light emitting layer in the first area to form a first sub light emitting unit, and the second area being used for forming a second sub light emitting unit. By dividing the same light emitting lamination layer into a plurality of sub light emitting units of the light emitting unit, the manufacturing method of the light emitting diode device improves the production efficiency, reduces the production cost, decreases the spacing between the sub light emitting units, and improves the resolution of the light emitting diode device. On the other hand, the plurality of sub light emitting units for example emit light with different colors, so as to realize the color luminescence.

For example, the manufacturing method of the light emitting diode device provided by at least one embodiment of the present disclosure further comprises: providing a substrate, forming a plurality of contact electrodes insulated from each other on the substrate; bonding the light emitting unit to the substrate for example by a flip chip bonding process so that the light emitting unit is electrically connected with corresponding contact electrodes. Therefore, the manufacturing method of provided by at least one embodiment bonds the plurality of sub light emitting units to the corresponding positions of the substrate by the flip chip bonding process to form the light emitting diode device, so as to simplify the manufacturing procedure, reduce the processing steps, improve the production efficiency and decrease the production cost.

Some embodiments of the present disclosure are described in detail below, but the present disclosure is not limited to these specific embodiments.

At least one embodiment of the present disclosure provides a manufacturing method of a light emitting diode (LED) device, FIG. 1 is a schematic diagram of the manufacturing method of the light emitting diode (LED) device provided by at least one embodiment of the present disclosure, FIGS. 2a-2j are process flow diagrams of the manufacturing method of the light emitting diode (LED) device provided by at least one embodiment of the present disclosure. FIGS. 2a-2j only show a part of the relevant structures so as to describe the manufacturing method more clearly.

For example, at least one embodiment provides the manufacturing method of the light emitting diode (LED) device, as shown in FIG. 1, the manufacturing method for example comprises the following steps:

Step S01: forming a light emitting lamination layer on a base substrate, the light emitting lamination layer comprising a first semiconductor layer with a first conductive type, a first light emitting layer, a second semiconductor layer with a second conductive type, a second light emitting layer and a third semiconductor layer with the first conductive type sequentially formed on the base substrate;

Step S02: dividing the light emitting lamination layer to form a plurality of light emitting units which are spaced from each other, each light emitting unit comprising a first area and a second area spaced from each other;

Step S03: removing the third semiconductor layer and the second light emitting layer in the first area to form a first sub light emitting unit, and the second area being used for forming a second sub light emitting unit.

By dividing the same light emitting lamination layer into a plurality of sub light emitting units of the light emitting unit, the manufacturing method of the light emitting diode device simplifies the production process, improves the production efficiency, reduces the production cost, decreases the spacing between the sub light emitting units, and improves the resolution of the light emitting diode device. On the other hand, the plurality of sub light emitting units for example emit light with different colors, so as to realize the color luminescence.

For example, the light emitting lamination layer further comprises a third light emitting layer and a fourth semiconductor layer with the second conductive type sequentially formed on the third semiconductor layer; each light emitting unit further comprises a third area spaced apart from the first area and the second area; and the manufacturing method of the LED comprises: removing the fourth semiconductor layer, the third light emitting layer, the third semiconductor layer and the second light emitting layer in the first area to form the first sub light emitting unit, removing the fourth semiconductor layer and the third light emitting layer in the second area to form the second sub light emitting unit, and the third area being used for forming a third sub light emitting unit.

Each light emitting unit comprises three sub light emitting units, which is taken as an example to describe the manufacturing method of the LED device of the embodiment in detail below. However, it should be noted that, the embodiments may also be applied to the light emitting unit which comprises two sub light emitting units or more than three sub light emitting units, the lights emitted by the sub light emitting units may be the same or different.

For example, as shown in FIG. 2a, the manufacturing method comprises: providing a base substrate 10, forming a first buffer layer 11 and a second buffer layer 12 on the base substrate 10 sequentially; then forming a light emitting lamination layer on the second buffer layer 12, the light emitting lamination layer comprising a first semiconductor layer 20 with a first conductive type, a first light emitting layer 30, a second semiconductor layer 21 with a second conductive type, a second light emitting layer 31, a third semiconductor layer 22 with the first conductive type, a third light emitting layer 32, a fourth semiconductor layer 23 with the second conductive type sequentially formed on the second buffer layer 12.

For example, the base substrate 10 is various appropriate base substrates, for example, the material of the base substrate 10 is sapphire ($Al_2O_3$), silicon (Si), GaAs, silicon carbide (SiC), lithium aluminate ($LiAlO_2$), aluminum nitride (AlN) or gallium nitride (GaN) and so on. For example, the base substrate 10 is various epitaxial wafers, etc. The embodiment does not limit the material of the base substrate 10.

For example, the first conductive type is a N type doped with a first impurity or a P type doped with a second impurity; correspondingly, the second conductive type is the P type doped with the second impurity or the N type doped with the first impurity. For example, the first impurity is a donor impurity, and the second impurity is an acceptor impurity. The first impurity and the second impurity for example are different elements according to the semiconductor material; for example, for a GaN semiconductor, the first impurity is a silicon (Si) element, and the second impurity is a magnesium (Mg) element.

For example, the materials of the first semiconductor layer 20, the second semiconductor layer 21, the third semiconductor layer 22 and the fourth semiconductor layer 23 are transparent doped nitride compounds. For example, the first semiconductor layer 20 and the third semiconductor layer 22 are P type doped GaN, and the second semiconductor layer 21 and the fourth semiconductor layer 23 are N type doped GaN. It should be noted that, the first semiconductor layer 20, the second semiconductor layer 21, the third semiconductor layer 22 and the fourth semiconductor layer 23 may be formed by other appropriate transparent materials, the embodiment does not limit thereto.

For example, the materials of the first buffer layer 11 and the second buffer layer 12 are transparent materials. For example, each of the first buffer layer 11 and the second buffer layer 12 is a low temperature nucleation layer formed by aluminum nitride (AlN), gallium nitride (GaN) and etc. The first buffer layer 11 for example is a low temperature GaN layer, and the second buffer layer 12 for example is a non-doped GaN layer. The first buffer layer 11 and the second buffer layer 12 alleviate the lattice mismatch between the base substrate 10 and the light emitting lamination layer, reduce the crystal defects caused by the lattice mismatch, reduce the dislocation density, improve the quality of the light emitting lamination layer, and also prevent the cracking of the light emitting lamination layer during the cooling process, etc.

It should be noted that, in the case that the lattice constant of the base substrate 10 is close to the lattice constant of the first semiconductor layer 20, the first buffer layer 11 and the second buffer layer 12 may be not provided. For example, in a case that the material of the base substrate 10 is GaN and the material of the first semiconductor layer 20 is the doped GaN, the GaN base substrate is a homogeneous base substrate and thus avoids problems such as stress, defect or cracking caused by lattice mismatch, thermal expansion mismatch and etc., so that the buffer layer is not needed to be provided.

For example, the first light emitting layer 30, the second light emitting layer 31 and the third light emitting layer 32 are various appropriate light emitting layers, and types of the first light emitting layer 30, the second light emitting layer 31 and the third light emitting layer 32 are identical or different from one another. For example, the first light emitting layer 30, the second light emitting layer 31 and the third light emitting layer 32 are intrinsic semiconductor layers or lower doped semiconductor layers (whose doping concentration is lower than that of the adjacent semiconductor layer with the same doping type), or are single layer quantum well (SQW) light emitting layers formed by quantum wells or multilayer quantum well (MQW) light emitting layers formed by the quantum wells. The first light emitting layer 30, the second light emitting layer 31 and the third light emitting layer 32, for example, are multilayers formed by the quantum well and the barrier layer which are alternatively provided. The quantum well is used as the light emitting layer to improve the luminescent efficiency and the brightness of the light emitting unit 100. However, it should be noted that, the embodiment does not limited thereto, the first light emitting layer 30, the second light emitting layer 31 and the third light emitting layer 32 may be single layer light emitting layers formed by quantum dots or multilayer light emitting layers formed by quantum dots.

For example, the wavelength of the light emitted from the first light emitting layer 30 is less than the wavelength of the light emitted from the second light emitting layer 31 and the wavelength of the light emitted from the third light emitting layer 32, the wavelength of the light emitted from the second light emitting layer 31 is less than the wavelength of the light emitted from the third light emitting layer 32, that is, the energy of the light emitted from the first light emitting layer 30 is the highest and the energy of the light emitted from the third light emitting layer 32 is the lowest, so that the light emitted from the first light emitting layer 30 is prevented from being absorbed by the second light emitting layer 31 and the third light emitting layer 32 and the light emitted from the second light emitting layer 31 is prevented from being absorbed by the third light emitting layer 32, so as to increase luminance brightness and enhance the luminance effect.

For example, the first light emitting layer 30, the second light emitting layer 31 and the third light emitting layer 32 are quantum well light emitting layers that emit light in the same or different wavebands. For example, the first light emitting layer 30 is a quantum well configured to emit light in blue waveband, and the material of a blue waveband light emitting layer for example comprises one or more selected from the group consisting of indium gallium nitride (InGaN), zinc selenide (ZnSe), indium gallium nitride/gallium nitride (InGaN/GaN) and so on. For example, the second light emitting layer 31 is a quantum well configured to emit light in green waveband, and the material of a green waveband light emitting layer for example comprises one or more selected from the group consisting of indium gallium nitride/gallium nitride (InGaN/GaN), gallium phosphide (GaP), aluminum phosphide (AlGaP) and so on. For example, the third light emitting layer 32 is a quantum well configured to emit light in red waveband, and the material of a red waveband light emitting layer for example comprises one or more selected from the group consisting of aluminum gallium arsenide (AlGaAs), gallium arsenide phosphide (GaAsP), gallium phosphide (GaP) and so on. In this way, the light emitting unit 100 achieves the color luminescence.

For example, the first light emitting layer 30, the second light emitting layer 31 and the third light emitting layer 32 are quantum well light emitting layers that emit light in the same waveband, for instance, they are quantum well light emitting layers configured to emit light in yellow waveband, and the material of a yellow waveband light emitting layer for example comprises one or more selected from the group consisting of gallium arsenide phosphide (GaAsP), gallium phosphide (GaP), zinc selenide (ZnSe), indium gallium nitride (InGaN), silicon carbide (SiC) and so on, so that the light emitting unit 100 achieves the monochromatic luminescence.

For example, the first light emitting layer 30, the second light emitting layer 31 and the third light emitting layer 32 emit invisible light, such as infrared light or ultraviolet light, the material of an infrared waveband light emitting layer for example comprises one or more selected from the group consisting of aluminum gallium arsenide (AlGaAs), aluminum gallium indium phosphide (AlGaInP), gallium phosphide doped with zinc oxide (GaP:ZnO) and so on, and the material of an ultraviolet waveband light emitting layer for example comprises one or more selected from the group consisting of aluminum nitride (AlN), aluminum gallium nitride (AlGaN) and so on.

For example, each layer of the light emitting lamination layer, the first buffer layer 11 and the second buffer layer 12 are deposited by metal organic chemical vapor deposition (MOCVD), hydride vapor phase epitaxy (HVPE), molecular beam epitaxy (MBE), metal organic vapor phase epitaxy (MOVPE), halide chemical vapor deposition (HCVD) or other methods.

For example, as shown in FIG. 2b, the manufacturing method further comprises dividing the light emitting lamination layer to form a plurality of light emitting units 100 which are spaced from each other. Each light emitting unit 100 comprises a first area A1, a second area A2 and a third area A3 spaced from each other.

Figure 2C:
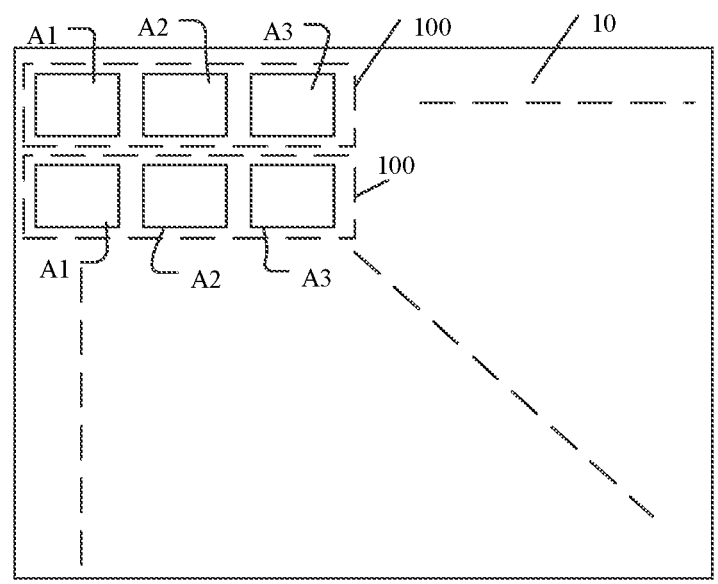

It should be noted that, although only one light emitting unit 100 is shown in the figure, those skilled in the art should know that the LED device may comprise a plurality of light emitting units 100. For example, FIG. 2c shows a planar structure diagram of the light emitting units after dividing the light emitting lamination layer, a plurality of light emitting units 100 are formed after dividing the light emitting lamination layer, and the plurality of light emitting units 100 for example are arranged as an array of M rows and N columns (M and N are integers), the first area A1, the second area A2 and the third area A3, for instance, are arranged in row or in column, and the embodiment does not limit thereto.

Figure 2D:
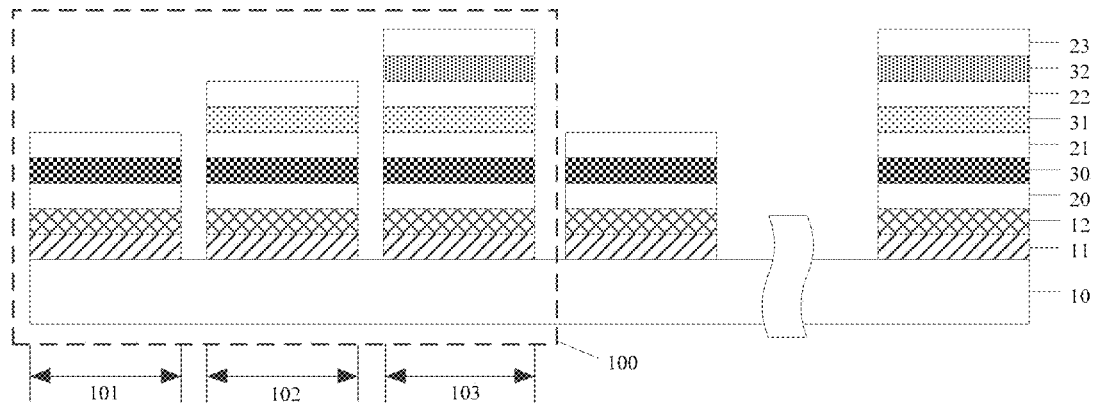

For example, as shown in FIG. 2d, the manufacturing method further comprises: sequentially removing the fourth semiconductor layer 23, the third light emitting layer 32, the third semiconductor layer 22 and the second light emitting layer 31 in the first area A1 by a first etching process to form a first sub light emitting unit 101; removing the fourth semiconductor layer 23 and the third light emitting layer 32 in the second area A2 sequentially by a second etching process to form a second sub light emitting unit 102, and the third area A3 being used for forming a third sub light emitting unit 103.

For example, methods such as dry etching or laser cutting, are adopted to divide the light emitting lamination layer, so as to reduce the spacing among the first area A1, the second area A2 and the third area A3 (for example, the spacing is reduced to 10 μm), thus reduce distances between the sub light emitting units, reduce the area of the light emitting unit 100, and improve the resolution.

For example, the first etching process and the second etching process are performed by the same patterning process, so as to reduce the production steps and decrease the production cost.

Figure 2E:
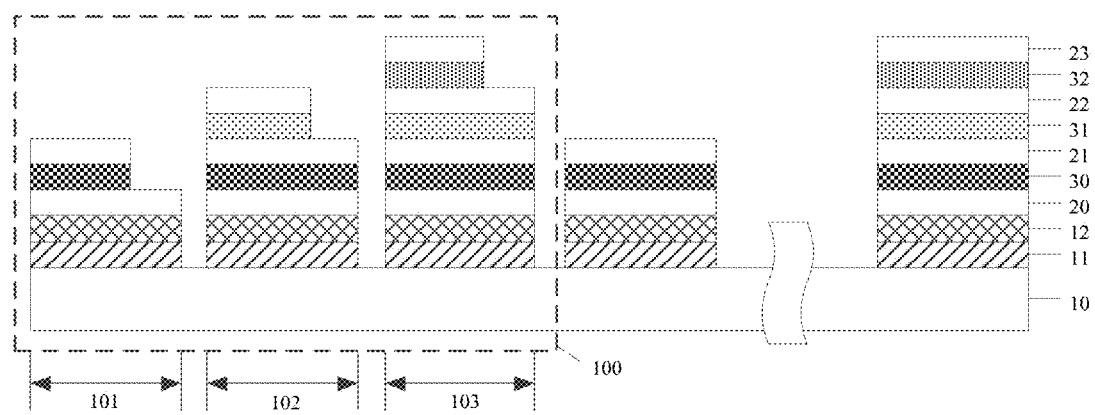

For example, as shown in FIG. 2e, the manufacturing method further comprises: etching the second semiconductor layer 21 and the first light emitting layer 30 of the first sub light emitting unit 101 by a third etching process to expose a portion of the first semiconductor layer 20; etching the third semiconductor layer 22 and the second light emitting layer 31 of the second sub light emitting unit 102 by a fourth etching process to expose a portion of the second semiconductor layer 21; and etching the fourth semiconductor layer 23 and the third light emitting layer 32 of the third sub light emitting unit 103 by a fifth etching process to expose a portion of the third semiconductor layer 22.

For example, the third etching process, the fourth etching process and the fifth etching process are performed by the same patterning process, so as to further reduce the production steps, shorten production time and decrease the production cost.

For example, the etching process is performed by a dry etching process or a wet etching process. For example, the dry etching process is performed by methods such as a chemical method (e.g. plasma etching, PE), a physical method (e.g. ion etching, IE), or a method of combining the chemical method with the physical method (e.g. reactive ion etching, RIE). For example, the etching process is performed by an ion beam etching (IBE), which has the characteristics such as good direction, good anisotropy, high resolution, high steepness, without etching restrictions and etc., thus the ion beam etching achieves accurate etching.

It should be noted that, "the same patterning process" refers to using one mask, coating photoresist one time and stripping photoresist one time during the process, "the same patterning process" comprises a single etching process or a plurality of etching processes. For example, the same patterning process adopts a graytone mask process or a halftone mask process, and the etching process adopts the ion beam etching. For example, firstly, coating a photoresist on the light emitting unit; exposing and developing the coated photoresist, so as to form a photoresist completely removed region, a photoresist partially reserved region and a photoresist completely reserved region in the first area A1, the second area A2 and the third area A3 respectively; removing the fourth semiconductor layer 23 and the third light emitting layer 32 in the first area A1 by the first etching process; removing the photoresist in the photoresist partially reserved region by an ashing process; removing the third semiconductor layer 22 and the second light emitting layer 31 in the first area A1 and the fourth semiconductor layer 23 and the third light emitting layer 32 in the second area A2 respectively by the second etching process, so as to form the first sub light emitting unit 101 and the second sub light emitting unit 102 respectively; and stripping the photoresist in the photoresist completely reserved region to form the third sub light emitting unit 103.

Figure 2F:
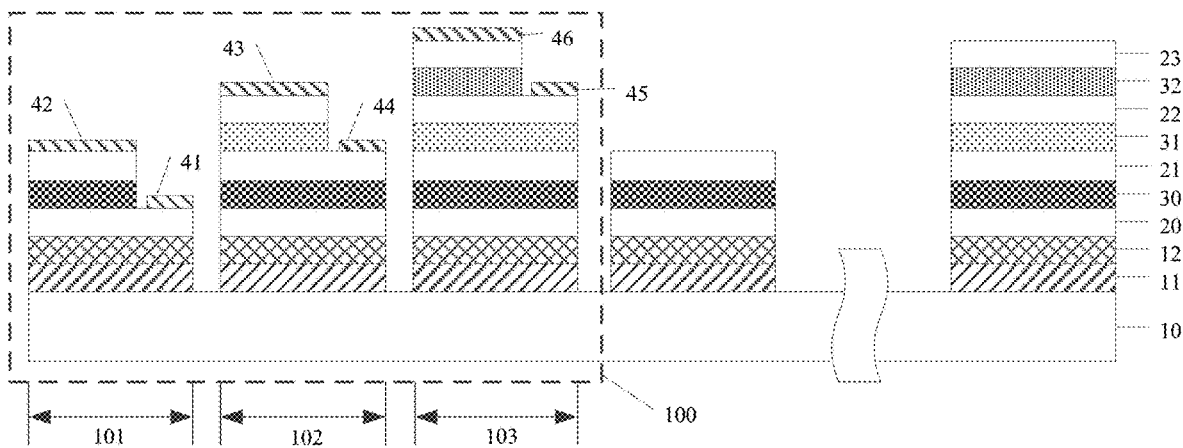

For example, as shown in FIG. 2f, in the first sub light emitting unit 101, a first electrode 41 and a second electrode 42 are formed on the exposed portion of the first semiconductor layer 20 and the second semiconductor layer 21 respectively; in the second sub light emitting unit 102, a third electrode 43 and a fourth electrode 44 are formed on the third semiconductor layer 22 and the exposed portion of the second semiconductor layer 21 respectively; and in the third sub light emitting unit 103, a fifth electrode 45 and a sixth electrode 46 are formed on the exposed portion of the third semiconductor layer 22 and the fourth semiconductor layer 23 respectively.

For example, materials of the first electrode 41, the second electrode 42, the third electrode 43, the fourth electrode 44, the fifth electrode 45 and the sixth electrode 46 are opaque conductive materials. The opaque conductive materials for example comprise titanium (Ti), platinum (Pt), gold (Au), chromium (Cr) and other metal materials. The opaque conductive materials for example comprise high reflective materials such as aluminum (Al), silver (Ag), so that the first electrode 41, the second electrode 42, the third electrode 43, the fourth electrode 44, the fifth electrode 45 and the sixth electrode 46 are high reflecting electrodes, thus in a case that the light emitting layer emits light, the absorption of the electrodes to the light is reduced, and the luminance brightness is increased. For example, materials of the first electrode 41, the second electrode 42, the third electrode 43, the fourth electrode 44, the fifth electrode 45 and the sixth electrode 46 are transparent conductive materials. The transparent conductive materials for example comprise indium tin oxide (ITO), indium zinc oxide (IZO), zinc oxide (ZnO), indium oxide ($In_2O_3$) or indium gallium oxide (IGO), etc. the embodiment does not limit thereto.

For example, the first electrode 41, the second electrode 42, the third electrode 43, the fourth electrode 44, the fifth electrode 45 and the sixth electrode 46 are formed by the same patterning process, or are formed by different patterning processes.

Figure 2G:
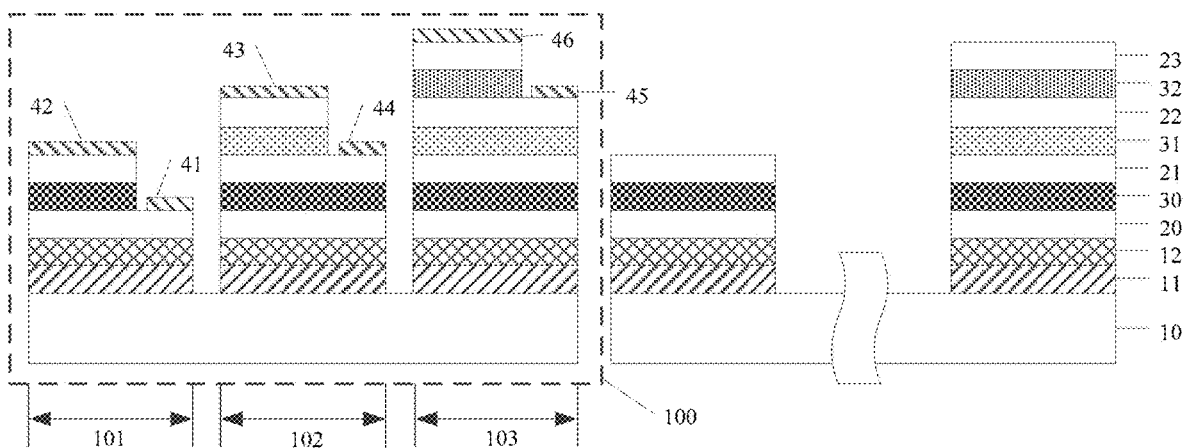

For example, as shown in FIG. 2g, the base substrate 10 is divided by taking the light emitting unit 100 as a unit, so as to form a plurality of light emitting units which are spaced from each other. For example, the base substrate 10 is divided by adopting a method such as laser cutting and the like.

Figure 2H:
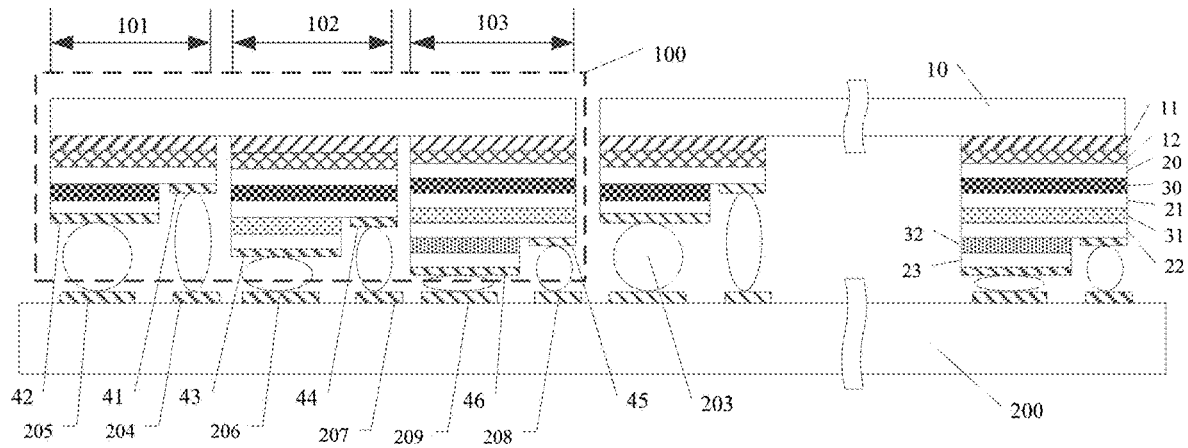

For example, as shown in FIG. 2h, the manufacturing method of the LED device provided by the embodiment further comprises: providing a substrate 200, forming a plurality of contact electrodes on the substrate 200; bonding the divided light emitting units 100 to the substrate 200 for example by a flip chip bonding process. The first electrode 41, the second electrode 42, the third electrode 43, the fourth electrode 44, the fifth electrode 45 and the sixth electrode 46 are electrically connected with corresponding contact electrodes respectively. The manufacturing method of the LED device bonds the plurality of sub light emitting units of the light emitting unit to the corresponding positions of the substrate 200 by one flip chip bonding process to form the light emitting diode device, so as to simplify the manufacturing procedure, improve the production efficiency and decrease the production cost.

For example, as shown in FIG. 2h, a first contact electrode 204, a second contact electrode 205, a third contact electrode 206, a fourth contact electrode 207, a fifth contact electrode 208 and a sixth contact electrode 209, which are insulated from each other, are formed on the substrate 200, so that the first electrode 41, the second electrode 42, the third electrode 43, the fourth electrode 44, the fifth electrode 45 and the sixth electrode 46 are respectively electrically connected with the first contact electrode 204, the second contact electrode 205, the third contact electrode 206, the fourth contact electrode 207, the fifth contact electrode 208 and the sixth contact electrode 209 in one to one manner. For example, a P type contact electrode and an N type contact electrode, which are insulated from each other, are formed on the substrate 200. In a case that the first electrode 41, the third electrode 43 and the fifth electrode 45 are N type electrodes and the second electrode 42, the fourth electrode 44 and the sixth electrode 46 are P type electrodes, the first electrode 41, the third electrode 43 and the fifth electrode 45 are electrically connected with the same N type contact electrode, and the second electrode 42, the fourth electrode 44 and the sixth electrode 46 are electrically connected with the same P type contact electrode; or, the first electrode 41, the third electrode 43 and the fifth electrode 45 are electrically connected with the different N type contact electrodes, and the second electrode 42, the fourth electrode 44 and the sixth electrode 46 are electrically connected with the different P type contact electrodes.

For example, the plurality of light emitting units 100 are bonded to different positions on the substrate 200 according to actual needs, so as to satisfy requirements of diversify, such as forming a LED digital clock.

For example, the substrate 200 is a transparent insulating substrate or a metal substrate. The transparent insulating substrate, for example, comprises a glass substrate, a quartz substrate, a ceramic substrate, or other appropriate substrates. The metal substrate, for example, comprises a copper-based substrate with a copper coating, an aluminum-based substrate with the copper coating, or an iron-based substrate with the copper coating and the like.

For example, the bonding adopts flip chip bonding, eutectic soldering, ultrasonic-thermo compression soldering, conductive adhesive bonding or other bonding technology. The flip chip bonding, for example, adopts bump soldering technology. For example, before the flip chip bonding, a conductive bump 203 is formed on each of the contact electrodes on the base substrate 200; then the first electrode 41, the second electrode 42, the third electrode 43, the fourth electrode 44, the fifth electrode 45 and the sixth electrode 46 in the light emitting unit 100 are aligned with the corresponding contact electrodes on the base substrate 200; and finally, by using the bump soldering technology, the first electrode 41, the second electrode 42, the third electrode 43, the fourth electrode 44, the fifth electrode 45 and the sixth electrode 46 are respectively bonded with the corresponding contact electrodes through the conductive bumps 203, so as to obtain the LED device. It should be noted to that, the light emitting unit 100, for example, may be transferred to the base substrate 200 by a transfer method, and the embodiment is not limited thereto.

For example, a material of the conductive bump 203 comprises one or more selected from the group consisting of gold, lead, tin, copper, silver, indium, etc.

For example, the conductive bump 203 is formed by printing, electroplating, chemical plating, metal sputtering and etc.

Figure 2I:
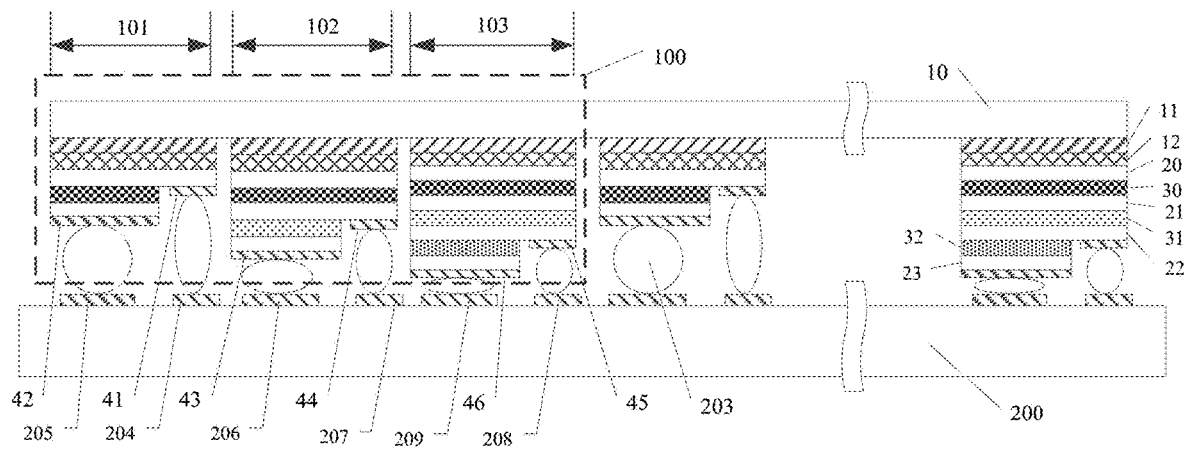

It should be noted that, in the manufacturing method of the LED device, the bonding may be performed firstly, then the light emitting unit 100 is divided or the substrate 10 is stripped directly. For example, as shown in FIG. 2i, the light emitting units 100 are bonded to the base substrate 200 by the flip chip bonding process, then the substrate 10 is stripped to form the LED device. For example, the plurality of light emitting units 100 are bonded to the base substrate 200 by one flip chip bonding process, so as to reduce the process step of individually bonding each light emitting unit 100 and shorten the production time; at the same time, the step of dividing the substrate 10 is omitted to further simplify the manufacturing procedure and decrease production cost.

Figure 2J:
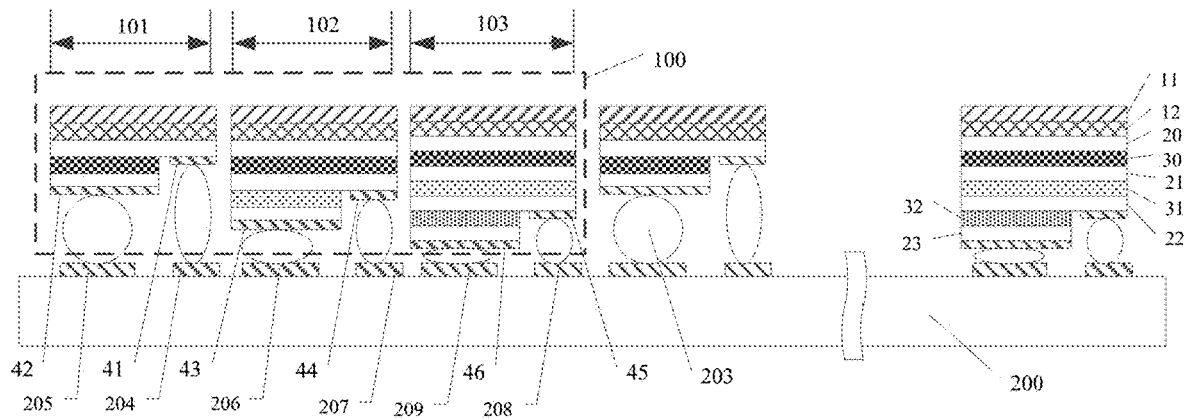

For example, as shown in FIG. 2j, the LED device is formed by stripping the substrate 10. Stripping the substrate 10, for example, adopts a laser stripping technology.

It should be noted that, in the case that the substrate 10 is a transparent substrate, the substrate 10 may be reserved, the step(s) of stripping the substrate 10 is omitted, so as to reduce the process step(s) and shorten the production time.

In the embodiments of the present disclosure, for example, the patterning process comprises a lithography patterning process. The lithography patterning process comprises: coating a photoresist film on a structural layer that needs to be patterned, the photoresist film for example being coated by methods such as spin coating, blade coating or roll coating; next, exposing the photoresist layer by using a mask, developing the exposed photoresist layer to obtain a photoresist pattern; then, etching the structural layer by using the photoresist pattern; finally stripping the photoresist to form the desired structure.

Figure 3:
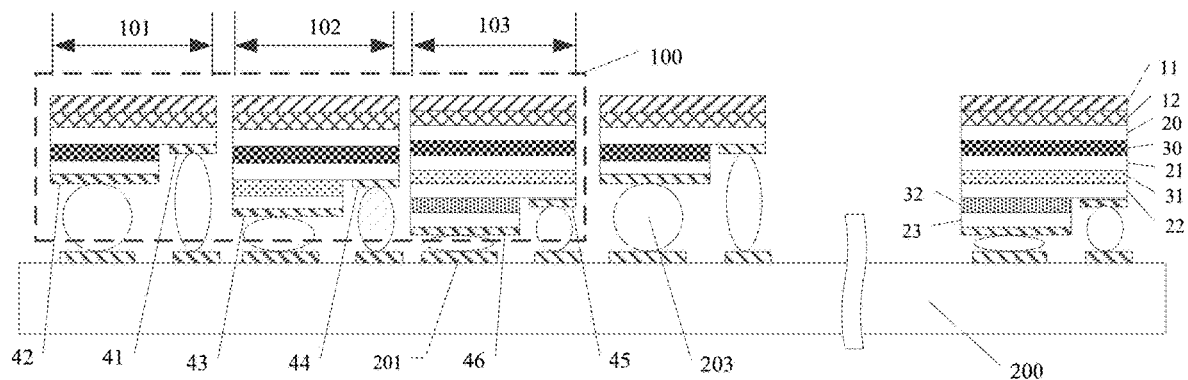
FIG. 3 is a schematic diagram of a cross-section structure of a light emitting diode (LED) device provided by an embodiment of the present disclosure.

At least one embodiment of the present embodiment provides a light emitting diode (LED) device that is formed by using the manufacturing method provided by the embodiment(s) above. FIG. 3 is a schematic diagram of a cross-section structure of the light emitting diode (LED) device provided by at least one embodiment of the present disclosure. FIG. 3 only shows a part of the relevant structure so as to describe the LED device more clearly.

For example, the LED device comprises a plurality of light emitting units. The plurality of light emitting units for example are arranged in an array with a plurality of rows and a plurality of columns. Each of the light emitting units for example comprises a plurality of sub light emitting units which are spaced apart from each other. For example, each of the light emitting units comprises a first sub light emitting unit and a second light emitting unit. For example, the first sub light emitting unit comprises a first semiconductor layer with a first conductive type, a first light emitting layer and a second semiconductor layer with a second conductive type, which are sequentially disposed; and the second sub light emitting unit comprises the first semiconductor layer, the first light emitting layer, the second semiconductor layer, a second light emitting layer and a third semiconductor layer with the first conductive type, which are sequentially disposed.

For example, each of the light emitting units further comprises a third sub light emitting unit spaced apart from the first sub light emitting unit and the second light emitting unit, and the third sub light emitting unit comprises the first semiconductor layer, the first light emitting layer, the second semiconductor layer, the second light emitting layer, the third semiconductor layer, a third light emitting layer and a fourth semiconductor layer with the second conductive type, which are sequentially disposed.

Each of the light emitting units comprises three sub light emitting units, which is taken as an example to describe the LED device of the disclosure in detail below, however each of the light emitting units is not limited to theses specific structures.

For example, as shown in FIG. 3, the LED device of the disclosure comprises a light emitting unit 100, and the light emitting unit 100 comprises a first sub light emitting unit 101, a second light emitting unit 102 and a third sub light emitting unit 103, which are spaced apart from each other.

For example, the first sub light emitting unit 101, the second light emitting unit 102 and the third sub light emitting unit 103 are arranged in the same row or the same column, or arranged in Δ form, etc.

For example, as shown in FIG. 3, the first sub light emitting unit 101 comprises a first semiconductor layer 20 with a first conductive type, a first light emitting layer 30 and a second semiconductor layer 21 with a second conductive type, which are sequentially disposed; the second sub light emitting unit 102 comprises the first semiconductor layer 20, the first light emitting layer 30, the second semiconductor layer 21, a second light emitting layer 31 and a third semiconductor layer 22 with the first conductive type, which are sequentially disposed; and the third sub light emitting unit 103 comprises the first semiconductor layer 20, the first light emitting layer 30, the second semiconductor layer 21, the second light emitting layer 31, the third semiconductor layer 22, a third light emitting layer 32 and a fourth semiconductor layer 23 with the second conductive type, which are sequentially disposed.

For example, the first semiconductor layer 20 and the third semiconductor layer 22 are semiconductor layers with the first conductive type doped with the same impurity or different impurities, the second semiconductor layer 21 and the fourth semiconductor layer 23 are semiconductor layers with the second conductive type doped with the same impurity or different impurities. The embodiment is not limited thereto. The doping types of the first conductive type and the second conductive type for example are the same as the method embodiment as described above, the materials of the first semiconductor layer 20, the second semiconductor layer 21, the third semiconductor layer 22 and the fourth semiconductor layer 23 for example are the same as the materials described in the above method embodiment, which will not be elaborated here.

For example, the first light emitting layer 30, the second light emitting layer 31 and the third light emitting layer 32 comprise a quantum well structure to limit the carriers, such as a single layer quantum well (SQW) structure or a multilayer quantum well (MQW) structure. Each of the first light emitting layer 30, the second light emitting layer 31 and the third light emitting layer 32, for example, comprises a multilayer structure in which a quantum well and a barrier layer are arranged alternately, the band gap of the quantum well is smaller than the band gap of the barrier layer adjacent to the quantum well, the band gap of the barrier layer is smaller than the band gap of the semiconductor layer with the first conductive type and the band gap of the semiconductor layer with the second conductive type, so as to effectively prevent the carrier from escaping and improve the internal quantum efficiency of the light emitting unit. However, the embodiment is not limited thereto, the first light emitting layer 30, the second light emitting layer 31 and the third light emitting layer 32, for example, comprises a quantum dot structure.

For example, the first light emitting layer 30, the second light emitting layer 31 and the third light emitting layer 32 are quantum well light emitting layers that emit light in the same or different wavebands. For example, the first light emitting layer 30 emits blue light, the second light emitting layer 31 emits green light, and the third light emitting layer 32 emits red light, so that the light emitting unit 100 achieves the color luminescence. For example, the first light emitting layer 30, the second light emitting layer 31 and the third light emitting layer 32 emit light with the same wavelength. The first light emitting layer 30, the second light emitting layer 31 and the third light emitting layer 32, for example, emit yellow light, so that the light emitting unit 100 achieves the monochromatic luminescence. The first light emitting layer 30, the second light emitting layer 31 and the third light emitting layer 32, for example, emit invisible light, such as infrared light or ultraviolet light.

For example, as shown in FIG. 3, in the first sub light emitting unit 101, the first light emitting layer 30 and the second semiconductor layer 21 partially cover the first semiconductor layer 20, a first electrode 41 is disposed on an exposed portion of the first semiconductor layer 20, and a second electrode 42 is disposed on the second semiconductor layer 21; in the second sub light emitting unit 102, the second light emitting layer 31 and the third semiconductor layer 22 partially cover the second semiconductor layer 21, a fourth electrode 44 is disposed on an exposed portion of the second semiconductor layer 21, and a third electrode 43 is disposed on the third semiconductor layer 22; in the third sub light emitting unit 103, the third light emitting layer 32 and the fourth semiconductor layer 23 partially cover the third semiconductor layer 22, a fifth electrode 45 is disposed on the exposed portion of the third semiconductor layer 22, and a sixth electrode 46 is disposed on the fourth semiconductor layer 23.

For example, the materials of the first electrode 41, the second electrode 42, the third electrode 43, the fourth electrode 44, the fifth electrode 45 and the sixth electrode 46 are the same as the materials described in the above method embodiment, which will not be elaborated here.

For example, in a case that the first semiconductor layer 20 and the third semiconductor layer 22 are N type semiconductor layers and the second semiconductor layer 21 and the fourth semiconductor layer 23 are P type semiconductor layers, the first electrode 41, the third electrode 43 and the fifth electrode 45 are N type electrodes, and the second electrode 42, the fourth electrode 44 and the sixth electrode 46 are P type electrodes. For example, the P type electrode comprises an ohmic contact layer and a high reflecting layer to form a high reflecting electrode, the ohmic contact layer reduces the contact resistance between the P type electrode and the semiconductor layer, the high reflecting layer reduces the absorption of the light by the P type electrode and reflects the light to the light emission side, so as to improve the light extraction efficiency and the luminance brightness of the light emitting layer. It should be noted that, the high reflecting layer, for instance, comprises multiple metal reflecting layers (for example, the multiple metal reflecting layers are formed by aluminum and silver), so as to improve current diffusion and heat dissipation property of the P type electrode.

It should be noted that, for each of the sub light emitting units, the voltage of the P type electrode needs to be greater than the voltage of the N type electrode, so as to provide a positive voltage for each of the sub light emitting units to drive the light emitting layer to emit light. For example, for the first sub light emitting unit 101, in a case that the first electrode 41 is the P type electrode and the second electrode 42 is the N type electrode, the voltage applied to the first electrode 41 is greater than the voltage applied to the second electrode 42.

For example, the light emitting unit 100 further comprises a buffer layer. The buffer layer for example is a low temperature nucleation layer formed by aluminum nitride (AlN) or gallium nitride (GaN) and etc. As shown in FIG. 3, the buffer layer, for example, comprises a second buffer layer 12 and a first buffer layer 11 sequentially disposed on the first semiconductor layer 20. For example, the first buffer layer 11 is a low temperature GaN layer, and the second buffer layer 12 is a non-doped GaN layer.

It should be noted that, in the embodiment, the structure of the light emitting unit 100 is not limited thereto, the structure of the light emitting unit 100 may comprise a current barrier layer, an intermediate barrier layer and the like.

For example, as shown in FIG. 3, the LED device provided by the embodiment further comprises a substrate 200. A plurality of contact electrodes 201, which are insulated from each other, are disposed on the substrate 200. The light emitting unit 100 is bonded to the substrate 200 by a flip chip bonding process, and the first electrode 41, the second electrode 42, the third electrode 43, the fourth electrode 44, the fifth electrode 45 and the sixth electrode 46 are electrically connected with corresponding contact electrodes 201 respectively.

For example, the type of the substrate 200 is the same as the type described in the above method embodiment, and the contact electrodes are the same as the contact electrodes described in the above method embodiment. For example, the first electrode 41, the second electrode 42, the third electrode 43, the fourth electrode 44, the fifth electrode 45 and the sixth electrode 46 are respectively electrically connected with different contact electrodes in one to one manner; or, multiple electrodes are electrically connected with the same contact electrode, provided that each light emitting unit achieves the forward conduction so as to drive each sub light emitting unit to emit light, which will not be elaborated here.

For example, the substrate 200 is a single layer substrate, or is a multilayer substrate including an insulating thermal conductivity layer and a circuit layer (not shown in FIG. 3). The insulating thermal conductivity layer improves the heat dissipation property of the substrate 200, so as to improve the luminous efficiency and stability of the light emitting unit 100 and prolong the service life of the LED device. The circuit layer, for example, comprises a drive circuit and so on, so as to drive the light emitting unit 100 to emit light. The contact electrode, for example, is connected to a drive chip, a power supply and the like (not shown in figures) by means of wires formed on the substrate 200.

For example, the LED device of the embodiment further comprises a plurality of conductive bumps 203, the first electrode 41, the second electrode 42, the third electrode 43, the fourth electrode 44, the fifth electrode 45 and the sixth electrode 46 are bonded with the corresponding contact electrodes 201 through the conductive bumps 203, and the contact electrodes 201 further are coupled to the drive chip, the power supply, and the like (not shown in figures). Materials of the conductive bumps 203, for example, comprise one or more selected from the group consisting of gold, lead, tin, copper, silver, indium, etc. For example, the conductive bumps 203 have various sizes and shapes to satisfy different electrodes. For example, in the direction perpendicular to the substrate 200, a conductive bump 203 corresponding to the first electrode 41 is the longest, and a conductive bump 203 corresponding to the sixth electrode 46 is the shortest.

For example, the LED device of the embodiment is a LED display panel, the LED display panel for example is applied to a television, a digital camera, a mobile phone, a watch, a tablet computer, a notebook computer, a navigator, or any product or components having any display function. And for example, the LED device of the embodiment is applied to landscape decoration, a outdoor display screen, an advertisement demonstration board, an identification indication or illumination, etc.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or area may be enlarged or narrowed, that is, the drawings are not drawn in a real scale.

(3) In case of no conflict, features in one embodiment or in different embodiments can be combined to obtain new embodiment(s).

What are described above are only specific embodiments of the present disclosure, the protection scope of the present disclosure is not limited thereto; the protection scope of the present disclosure should be based on the protection scope of the claims.

The application claims priority to the Chinese patent application No. 201710153752.5, filed Mar. 15, 2017, the entire disclosure of which is incorporated herein by reference as part of the present application.

The invention claimed is:

1. A light emitting diode (LED) device, comprising:
a light emitting unit, the light emitting unit comprising a first sub light emitting unit and a second sub light emitting unit spaced apart from each other; wherein,
the first sub light emitting unit comprises a first semiconductor layer with a first conductive type, a first light emitting layer, and a second semiconductor layer with a second conductive type, which are sequentially disposed; and
the second sub light emitting unit comprises the first semiconductor layer, the first light emitting layer, the second semiconductor layer, a second light emitting layer, and a third semiconductor layer with the first conductive type, which are sequentially disposed,
wherein, in a region provided with the first sub light emitting unit, the second semiconductor layer is an outermost semiconductor layer, without being covered by any other semiconductor layers, in a direction from the first semiconductor layer to the second semiconductor layer,
wherein, in a region provided with the second sub light emitting unit, the third semiconductor layer is an outermost semiconductor layer, without being covered by any other semiconductor layers, in a direction from the first semiconductor layer to the third semiconductor layer, and wherein in the second sub light emitting unit, the second semiconductor layer is between the first light emitting layer and the second light emitting layer and directly contacts each of the first light emitting layer and the second light emitting layer.

2. The light emitting diode device according to claim 1, wherein in the first sub light emitting unit, the first light emitting layer and the second semiconductor layer partially cover the first semiconductor layer, a first electrode is disposed on an exposed portion of the first semiconductor layer, and a second electrode is disposed on the second semiconductor layer; and in the second sub light emitting unit, the second light emitting layer and the third semiconductor layer partially cover the second semiconductor layer, a fourth electrode is disposed on an exposed portion of the second semiconductor layer, and a third electrode is disposed on the third semiconductor layer.

3. The light emitting diode device according to claim 2, wherein the light emitting unit further comprises a third sub light emitting unit spaced apart from the first sub light emitting unit and the second sub light emitting unit, the third sub light emitting unit comprises the first semiconductor layer, the first light emitting layer, the second semiconductor layer, the second light emitting layer, the third semiconductor layer, a third light emitting layer, and a fourth semiconductor layer with the second conductive type, which are sequentially disposed, wherein, in a region provided with the third sub light emitting unit, the fourth semiconductor layer is an outermost semiconductor layer in a direction from the first semiconductor layer to the fourth semiconductor layer.

4. The light emitting diode device according to claim 3, wherein in the third sub light emitting unit, the third light emitting layer and the fourth semiconductor layer partially cover the third semiconductor layer, a fifth electrode is disposed on an exposed portion of the third semiconductor layer, and a sixth electrode is disposed on the fourth semiconductor layer.

5. The light emitting diode device according to claim 4, further comprising: a substrate, the substrate comprising a plurality of contact electrodes insulated from each other, wherein the light emitting unit is bonded to the substrate in an arrangement wherein the second semiconductor layer is closer to the substrate than is the first semiconductor layer, and the light emitting unit is electrically connected with corresponding contact electrodes.

6. The light emitting diode device according to claim 3, wherein a wavelength of light emitted from the first light emitting layer is less than a wavelength of light emitted from the second light emitting layer and a wavelength of light emitted from the third light emitting layer, and the wavelength of the light emitted from the second light emitting layer is less than the wavelength of the light emitted from the third light emitting layer.

7. The light emitting diode device according to claim 2, further comprising: a substrate, the substrate comprising a plurality of contact electrodes insulated from each other, wherein the light emitting unit is bonded to the substrate in an arrangement wherein the second semiconductor layer is closer to the substrate than is the first semiconductor layer, and the light emitting unit is electrically connected with corresponding contact electrodes.

8. The light emitting diode device according to claim 2, wherein the first electrode is electrically disconnected with the fourth electrode, and the second electrode is electrically disconnected with the third electrode.

9. The light emitting diode device according to claim 1, wherein the first sub light emitting unit does not comprise a layer provided in a same layer as the second light emitting layer, and the first sub light emitting unit does not comprise a layer provided in a same layer as the third semiconductor layer with the first conductive type.

10. The light emitting diode device according to claim 1, wherein a color of light emitted by the first sub light emitting unit is different from a color of light emitted by the second sub light emitting unit.

11. A manufacturing method of a light emitting diode (LED) device, comprising:

forming a light emitting lamination layer on a base substrate, the light emitting lamination layer comprising a first semiconductor layer with a first conductive type, a first light emitting layer, a second semiconductor layer with a second conductive type, a second light emitting layer, and a third semiconductor layer with the first conductive type sequentially formed on the base substrate;

dividing the light emitting lamination layer to form a light emitting unit, the light emitting unit comprising a first area and a second area spaced from each other; and completely removing the third semiconductor layer and the second light emitting layer in the first area to form a first sub light emitting unit comprising the first semiconductor layer, the first light emitting layer, and the second semiconductor layer in the first area, and form a second sub light emitting unit comprising the first semiconductor layer, the first light emitting layer, the second semiconductor layer, the second light emitting layer, and the third semiconductor layer in the second area, wherein, in a region provided with the first sub light emitting unit, the second semiconductor layer is an outermost semiconductor layer, without being covered by any other semiconductor layers, in a direction from the first semiconductor layer to the second semiconductor layer, wherein, in a region provided with the second sub light emitting unit, the third semiconductor layer is an outermost semiconductor layer, without being covered by any other semiconductor layers, in a direction from the first semiconductor layer to the third semiconductor layer, and wherein in the second sub light emitting unit, the second semiconductor layer is between the first light emitting layer and the second light emitting layer and directly contacts each of the first light emitting layer and the second light emitting layer.

12. The manufacturing method of the light emitting diode device according to claim 11, further comprising:

etching the second semiconductor layer and the first light emitting layer of the first sub light emitting unit to expose a portion of the first semiconductor layer; and etching the third semiconductor layer and the second light emitting layer of the second sub light emitting unit to expose a portion of the second semiconductor layer.

13. The manufacturing method of the light emitting diode device according to claim 12, further comprising:
- in the first sub light emitting unit, forming a first electrode and a second electrode respectively on an exposed portion of the first semiconductor layer and the second semiconductor layer; and
- in the second sub light emitting unit, forming a third electrode and a fourth electrode respectively on the third semiconductor layer and an exposed portion of the second semiconductor layer.

14. The manufacturing method of the light emitting diode device according to claim 13, wherein
- the light emitting lamination layer further comprises a third light emitting layer and a fourth semiconductor layer with the second conductive type sequentially formed on the third semiconductor layer; the light emitting unit further comprises a third area spaced apart from the first area and the second area; and
- the manufacturing method further comprises:
  - completely removing the fourth semiconductor layer, the third light emitting layer, the third semiconductor layer, and the second light emitting layer in the first area to form the first sub light emitting unit;
  - completely removing the fourth semiconductor layer and the third light emitting layer in the second area to form the second sub light emitting unit; and
  - forming a third sub light emitting unit comprising the first semiconductor layer, the first light emitting layer, the second semiconductor layer, the second light emitting layer, the third semiconductor layer, the third light emitting layer, and the fourth semiconductor layer in the third area,
  - wherein in a region provided with the third sub light emitting unit, the fourth semiconductor layer is an outermost semiconductor layer in a direction from the first semiconductor layer to the fourth semiconductor layer.

15. The manufacturing method of the light emitting diode device according to claim 14, further comprising:
- etching the fourth semiconductor layer and the third light emitting layer of the third sub light emitting unit to expose a portion of the third semiconductor layer.

16. The manufacturing method of the light emitting diode device according to claim 15, further comprising:
- in the third sub light emitting unit, forming a fifth electrode and a sixth electrode respectively on an exposed portion of the third semiconductor layer and the fourth semiconductor layer.

17. The manufacturing method of the light emitting diode device according to claim 16, further comprising:
- providing a substrate;
- forming a plurality of contact electrodes insulated from each other on the substrate; and
- bonding the light emitting unit to the substrate in an arrangement wherein the second semiconductor layer is closer to the substrate than is the first semiconductor layer, the light emitting unit being electrically connected with corresponding contact electrodes.

18. The manufacturing method of the light emitting diode device according to claim 13, further comprising:
- providing a substrate;
- forming a plurality of contact electrodes insulated from each other on the substrate; and
- bonding the light emitting unit to the substrate in an arrangement wherein the second semiconductor layer is closer to the substrate than is the first semiconductor layer, the light emitting unit being electrically connected with corresponding contact electrodes.

19. The manufacturing method of the light emitting diode device according to claim 11, further comprising: forming a buffer layer on the base substrate, wherein the forming the light emitting lamination layer on the base substrate comprises forming the light emitting lamination layer on the buffer layer.

20. The manufacturing method of the light emitting diode device according to claim 11, wherein the first sub light emitting unit does not comprise a layer provided in a same layer as the second light emitting layer, and the first sub light emitting unit does not comprise a layer provided in a same layer as the third semiconductor layer with the first conductive type.

* * * * *